US006749478B2

(12) United States Patent
Lamouri et al.

(10) Patent No.: US 6,749,478 B2
(45) Date of Patent: Jun. 15, 2004

(54) METHOD OF MAKING AN ELECTRIC LAMP HAVING A GAS FILLED OUTER JACKET

(75) Inventors: Abbas Lamouri, Aurora, OH (US); David Earl Bassett, Peninsula, OH (US)

(73) Assignee: Advance Lighting Technologies, Inc., Solon, OH (US)

( * ) Notice: Subject to any disclaimer, the term of this patent is extended or adjusted under 35 U.S.C. 154(b) by 0 days.

(21) Appl. No.: 09/973,916

(22) Filed: Oct. 11, 2001

(65) Prior Publication Data

US 2003/0073373 A1 Apr. 17, 2003

(51) Int. Cl.[7] ................................................ H01L 9/395
(52) U.S. Cl. ......................................................... 445/26
(58) Field of Search ...................................... 445/26, 43

(56) References Cited

U.S. PATENT DOCUMENTS

| | | | | |
|---|---|---|---|---|
| 4,161,672 A | * | 7/1979 | Cap et al. | 313/620 |
| 4,389,201 A | | 6/1983 | Hansler et al. | 445/26 |
| 5,176,558 A | | 1/1993 | Newell | 445/26 |

* cited by examiner

*Primary Examiner*—Kenneth J. Ramsey
(74) *Attorney, Agent, or Firm*—Duane Morris LLP

(57) ABSTRACT

A method of making an electric lamp having a gas filled outer jacket wherein the space enveloped by the jacket may be flushed and filled with the desired fill gas without the use of a mechanical evacuation system including an exhaust pump. The space may be flushed and filled to obtain a controlled atmosphere within the space by inserting a gas dispensing probe into the space to displace the uncontrolled atmosphere with the fill gas. The final pressure of the fill gas which is sealed within the space may be controlled by controlling the temperature of the fill gas during the flush/fill procedure until the outer jacket is sealed.

28 Claims, 1 Drawing Sheet

METHOD OF MAKING AN ELECTRIC LAMP HAVING A GAS FILLED OUTER JACKET

BACKGROUND OF THE INVENTION

The present invention generally relates to electric lamps and methods of manufacture. More specifically, the present invention relates to lamps having a gas filled outer lamp jacket.

In the manufacture of electric lamps, it is often desirable to provide a controlled atmosphere for many of the components of the lamp to prevent premature failure of the components and thereby prolong the operating life of the lamp. For example, the exposure of the filament of an incandescent lamp or the arc tube of an HID lamp to even very small amounts of oxygen during lamp operation will significantly degrade the components leading to lamp failure; thus shortening the operating life of the lamp. To prevent the exposure of such components to damaging atmospheres, it is well known to provide a controlled atmosphere for the components by enveloping the components in the desired atmosphere contained within an outer lamp jacket.

Many lamps are constructed having a lamp stem mounted at an open end of the outer lamp jacket. The typical lamp stem is formed from a glass tube having one or more electrical leads sealed at a pinched end of the tube and an exhaust tube forming a fluid passage through the stem. When the stem is mounted at the base of the outer lamp jacket, the exhaust tube provides the only fluid communication between the interior and the exterior of the outer lamp jacket. Once the outer lamp jacket has been evacuated and then filled with the desired fill gas, the stem exhaust tube is sealed to thereby hermetically seal the outer lamp jacket.

In lamps constructed with a stem, the known methods of controlling the atmosphere within the outer lamp jacket include the steps of evacuating the ambient atmosphere from the outer lamp jacket through the stem exhaust tube, and then either maintaining a vacuum or back-filling the jacket with a controlled atmosphere such as an inert gas. The known methods for evacuating the jacket through the stem exhaust tube include systems having one or more exhaust pumps and oil lubricated rotary valves to mechanically pump the ambient atmosphere from the interior of the jacket. Such methods suffer from several disadvantages. The pumps and valves are costly and require time consuming and costly maintenance to operate. Further, oil from the rotary valves may become atomized and then carried into the outer jacket during the flush or fill process. The presence of oil is known to be detrimental to the operation of many types of lamps. For example, the presence of oil may cause sodium loss in metal halide lamps and may lead to lamp failure.

It is often desirable to provide lamps wherein the pressure of the fill gas within the outer lamp jacket is other than atmospheric pressure at substantially room temperature. For example, many HID lamps include subatmospheric fill gas within the outer jacket to improve the containment of debris in the event of a failure of the arc tube mounted within the jacket. In the manufacture of lamps having stems, the vacuum pump system used to flush and fill the outer jacket is also used to control the final pressure of the fill gas. Thus the known methods of controlling fill gas pressure also suffer from the same disadvantages resulting from the use of the vacuum pump system to exhaust the outer jacket.

Accordingly, it is an object of the present invention to obviate many of the deficiencies of the prior art and provide a novel method of manufacturing electric lamps having gas filled outer lamp jackets.

It is another object of the present invention to provide a novel method of making lamps which obviates the need to use a vacuum pump system.

It is a further object of the present invention to provide a novel method of flushing and filling the outer lamp jacket of a lamp having a stem by discharging the fill gas into the interior of the outer jacket.

It is a further object of the present invention to provide a novel method of making lamps in which the interior of the outer lamp jacket remains open to an uncontrolled atmosphere during the step of sealing the stem exhaust tube.

It is yet another object of the present invention to provide a novel method of making lamps in which communication of an inert outer jacket fill gas with an uncontrolled atmosphere such as air is maintained until the outer jacket is hermetically sealed.

It is yet a further object of the present invention to provide a novel method of making lamps which obviates the need to use a vacuum pump system to control the final pressure of the fill gas contained within the outer lamp jacket.

It is still another object of the present invention to provide a novel method of making lamps in which the temperature of the fill gas contained within the outer lamp jacket is controlled until the jacket is sealed.

It is yet another object of the present invention to provide a novel method of making lamps having subatmospheric fill pressure within the outer lamp jacket in which there is no pressure differential at the time of sealing the jacket.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
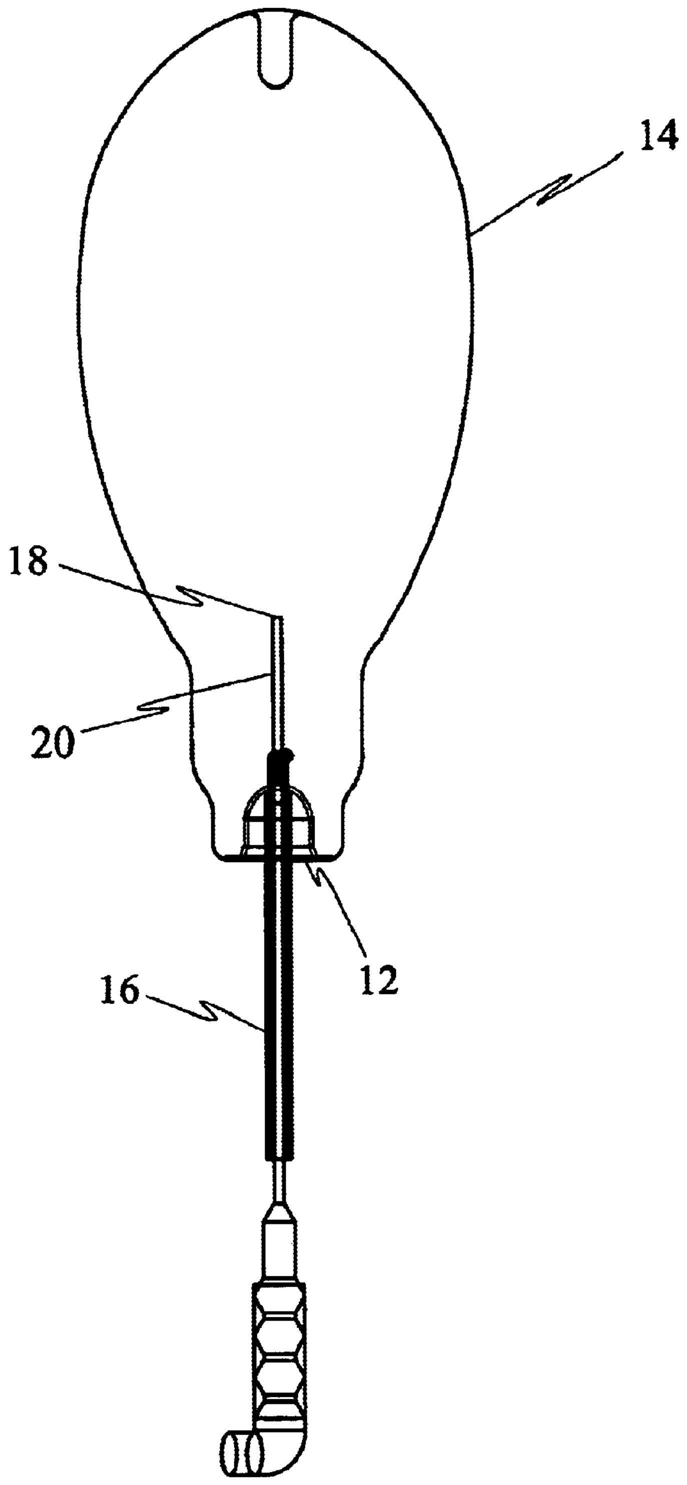
FIG. 1 is an illustration of certain steps in the manufacture of a single-ended HID lamp according to one aspect of the present invention.

The present invention finds utility in the manufacture of all types and sizes of electric lamps having gas filled outer lamp jackets. By way of example only, certain aspects of the present invention will be described in connection with the manufacture of HID lamps having a lamp stem mounted at the single open end of the outer lamp jacket.

FIG. 1 illustrates certain steps in the manufacture of a single-ended HID lamp according to one aspect of the present invention. The stem leads, arc tube, and arc tube mounting frame have been omitted from FIG. 1 for improved clarity in describing the outer jacket flush and fill process. With reference to FIG. 1, the lamp stem 12 is sealed to the outer lamp jacket 14 at the open end thereof so that the stem exhaust tube 16 provides the only fluid communication between the interior and the exterior of the outer jacket 14.

At the time the stem 12 is sealed to the outer jacket 14, the interior of the outer jacket 14 typically contains the ambient atmosphere. To provide a controlled atmosphere within the outer lamp jacket 14, it is necessary to remove the ambient atmosphere from the jacket and fill the jacket with the desired atmosphere. According to one aspect of the present invention, the gas dispensing end 18 of a gas dispensing probe 20 is inserted into the interior of the outer jacket 14 through the stem exhaust tube 16. The desired flush gas is then dispensed into the interior of the jacket 14 to displace the ambient atmosphere enveloped by the outer jacket 14, thereby flushing the ambient atmosphere from the jacket.

The gas dispensing probe 20 and the stem exhaust tube 16 are dimensioned so that the ambient gas may escape from the interior of the jacket 14 through the exhaust tube 16 while the probe 20 is inserted therethrough.

The flow rate of the flush gas and the duration of the flush may be controlled to determine the amount of ambient gas displaced from the interior of the jacket 14. The flow rate for the flush gas may be set at any practical rate, typically between one tenth and one hundred Standard Cubic Feet per Hour (SCFH). Once the flow rate is adjusted to obtain the desired flow, the interior of the jacket 14 is flushed for a period of time determined by the volume of ambient atmosphere to be displaced. The duration of the flush, depending on the flow rate, may be as short as five seconds or as long as fifteen minutes. For a standard metal halide ED37 lamp, the flow rate is typically adjusted to about 10 SCFH for flush with a duration of about five minutes.

After the completion of the outer jacket flush, the flow of flush gas is secured and the fill gas is discharged into the jacket 14 from the probe 20. The transition from a flow of flush gas to a flow of fill gas may be accomplished without removing the probe 20 from the exhaust tube 16. The fill gas is discharged into the jacket 14 at a rate and duration sufficient to displace the flush gas from the interior of the jacket.

The composition of the flush and fill gases are selected according to the specific requirements of the specific lamp type. Typically, the flush gas is a non-reactive gas such as nitrogen. The fill gas is typically one or more gases selected from the group consisting of neon, argon, xenon, krypton, or nitrogen. The flush gas and the fill gas may also have the same composition which eliminates the step of displacing the flush gas after the ambient atmosphere has been flushed from the jacket.

In some instances it may be desirable to include an amount of a reactive gas such as oxygen in the flush and/or fill gas. For example, the flush gas may contain an amount of oxygen and the temperature of the lamp may be elevated during the flush process to remove volatile hydrocarbon contaminants from the lamp.

After the outer jacket has been filled with the fill gas, probe 20 is removed from the stem exhaust tube 16 and the exhaust tube 16 is sealed to thereby hermetically seal the outer jacket 14. The exhaust tube 16 may be sealed using any conventional means such as pinch sealing.

As is apparent from the description, the present invention provides a process for flushing and filling the outer jacket of any type of stemmed lamp which is cost efficient and easy to automate. The present invention obviates the need to use the costly and maintenance intensive vacuum pump and rotary valve systems to flush and fill the lamp jackets to obtain a controlled atmosphere contained within the jacket.

As earlier explained, it is often desirable to obtain a fill gas at a pressure other than atmospheric pressure at substantially room temperature. In another aspect of the present invention, the temperature of the fill gas at the time the jacket 14 is hermetically sealed may be controlled to obtain the desired fill gas pressure. During the flushing and filling process, fluid communication between the fill gas an the ambient atmosphere surrounding the jacket is maintained until the jacket is sealed. Thus the fill gas remain at the same pressure as the ambient atmosphere throughout the process.

To obtain a subatmospheric fill gas pressure, the temperature of the fill gas may be elevated at the time of sealing so that the density of the fill gas enveloped by the jacket is reduced relative to the density of the fill gas at standard atmospheric pressure and temperature. Once the jacket is sealed and the temperature of the fill gas is no longer elevated, the pressure of the fill gas will be less than atmospheric pressure. The final fill gas pressure may be determined by the temperature of the fill gas at the time the jacket is sealed. Conversely, a superatmospheric fill gas pressure may be obtained by lowering the temperature of the fill gas at the time the jacket is sealed.

Some aspects of the present invention find utility in the manufacture of any type of lamp having a gas-filled outer jacket, regardless of whether the lamp is constructed with a stem. While it is known to flush and fill the space formed by the adjoining reflector and lense of a PAR lamp by insertion of a gas dispensing probe into the space, it has been discovered that such a flush and fill process may be used in the manufacture of any stemless lamp. It has further been discovered that the final pressure of the fill gas in any type of lamp may be controlled by maintaining fluid communication between the fill gas and the ambient atmosphere while controlling the temperature of the fill gas at the time the lamp is hermetically sealed.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of making a lamp having a gas filled outer jacket, the method comprising the steps of:

(a) providing a lamp having an outer jacket connected at a single open end thereof to a lamp stem;

(b) providing fluid communication between the space enveloped by the outer jacket and the exterior of the outer jacket through a tubular passage in the lamp stem;

(c) inserting a gas dispensing probe into the space enveloped by the outer lamp jacket through the tubular passage in the lamp stem;

(d) dispensing flush gas into the space enveloped by the outer lamp jacket from the gas dispensing probe while providing for passage of gas from the space to the exterior of the outer lamp jacket through the tubular passage to thereby displace a predetermined amount of the gas within the space by the flush gas;

(e) dispensing fill gas into the space enveloped by the outer lamp jacket from the gas dispensing probe while providing for passage of gas from the space to the exterior of the outer lamp jacket through the tubular passage to thereby displace a predetermined amount of the gas within the space by the fill gas;

(f) removing at least a portion of the gas dispensing probe from the tubular passage; and (g) sealing the tubular passage to thereby hermetically seal the space enveloped by the outer lamp jacket.

2. The method of claim 1 wherein the gas dispensing probe substantially coaxial with the longitudinal axis of the lamp.

3. The method of claim 1 including the step of maintaining the pressure of the fill gas at substantially atmospheric pressure while modifying the temperature of the fill gas relative to room temperature at the time the space enveloped by the outer jacket is hermetically sealed so that the pressure of the fill gas sealed within the space will differ from atmospheric pressure when the fill gas returns to room temperature.

4. The method of claim 3 wherein the temperature of the fill gas is elevated relative to room temperature at the time the space enveloped by the outer lamp jacket is hermetically sealed so that the pressure of the fill gas sealed within the space will be subatmospheric at room temperature.

5. The method of claim 4 wherein the pressure of the fill gas sealed within the space enveloped by the outer lamp jacket is less than about 150 torr.

6. The method of claim 4 further comprising the step of heating the lamp in an oven prior to the step of sealing the tubular passage to thereby elevate the temperature of the inert fill gas relative to room temperature.

7. The method of claim 4 further comprising the step of heating at least a portion of the outer lamp jacket during the step of sealing the tubular passage to thereby elevate the temperature of the inert fill gas relative to room temperature.

8. The method of claim 3 wherein the temperature of the fill gas is reduced relative to room temperature at the time the space enveloped by the outer lamp jacket is hermetically sealed so that the pressure of the fill gas will be superatmospheric at room temperature.

9. The method of claim 8 further comprising the step of cooling at least a portion of the outer lamp jacket during the step of sealing the tubular passage to thereby reduce the temperature of the inert fill gas relative to room temperature.

10. The method of claim 1 wherein the composition of the flush gas and the fill gas are substantially the same.

11. The method of claim 1 wherein the flush gas and the fill gas are inert.

12. The method of claim 1 wherein the fill gas comprises one or more gasses from the group consisting of neon, argon, krypton, xenon, and nitrogen.

13. The method of claim 1 including the steps of introducing a predetermined amount of a reactive flush gas into the space enveloped by the outer lamp jacket and elevating the temperature of the flush gas above a predetermined temperature for a predetermined amount of time.

14. The method of claim 1 wherein the fill gas includes a reactive gas.

15. The method of claim 1 wherein the flush gas is dispensed into the space at a rate at least about one tenth of one standard cubic foot per hour but not greater than about one hundred standard cubic feet per hour.

16. The method of claim 15 wherein the flush gas is dispensed into the space for a period of not more than about fifteen minutes but not less than about five seconds.

17. In a method of making a lamp having a gas filled outer lamp jacket sealed at a single open end thereof to a lamp stem, the method including the steps of removing the ambient gas from the space enveloped by the outer lamp jacket, filling the space with an inert fill gas, and then hermetically sealing the space, the improvement wherein the ambient gas is removed from the space by introduction of a flush gas into the space through a tubular opening in the lamp stem to thereby displace the ambient gas from the space.

18. The method of claim 17 wherein the flush gas is introduced into the space by inserting the gas dispensing end of a gas dispensing probe into the space through a generally tubular passage through the lamp stem and dispensing the flush gas therefrom.

19. The method of claim 18 wherein the gas dispensing probe is inserted into the space substantially along the longitudinal axis of the lamp.

20. In a method of making a lamp having a gas filled outer lamp jacket sealed at a single open end thereof to a lamp stem, the method including the steps of removing the ambient gas from the space enveloped by the outer lamp jacket, filling the space with an inert fill gas, and then hermetically sealing the space, the improvement wherein the ambient gas is removed from the space without a mechanical pump.

21. In a method of making a lamp including the steps of flushing and filling the space enveloped by the outer lamp jacket with a fill gas through a tubular passage in the lamp stem, the improvement wherein the fill gas is introduced into the space by a gas dispensing probe extending through the tubular passage so that the fill gas is dispensed from the probe into the space.

22. In a method of making a lamp having a gas filled outer lamp jacket wherein the pressure of the gas is other than atmospheric pressure at substantially room temperature, the method including the steps of flushing and filling the space enveloped by the outer lamp jacket with a fill gas and then hermetically sealing the space, the improvement comprising the step of maintaining the temperature of the fill gas at a predetermined temperature above or below room temperature while the space is sealed so that the pressure of the fill gas will be other than atmospheric pressure when the temperature of the fill gas is substantially room temperature.

23. A method of making a lamp wherein the outer lamp jacket envelopes fill gas at subatmospheric pressure at substantially room temperature, said method comprising the steps of:

elevating the temperature of the fill gas in the space enveloped by the outer lamp jacket relative to the temperature of an uncontrolled atmosphere surrounding the lamp at substantially atmospheric pressure while maintaining communication between the fill gas and the surrounding atmosphere;

controlling the elevated fill gas temperature in a predetermined temperature range; and hermetically sealing the outer lamp jacket while the temperature of the fill gas is within the predetermined temperature range so that the pressure of the fill gas sealed within the space enveloped by the outer lamp jacket will be subatmospheric when the temperature of the fill gas is no longer elevated.

24. In a method of making a lamp including the steps of introducing lamp fill gas into the interior of the outer lamp jacket through an open tubular passage through the lamp stem and then forming a seal in the tubular passage to thereby hermetically seal the interior of the outer lamp jacket from the surrounding atmosphere wherein the pressure of the fill gas sealed within the interior of the jacket is other than atmospheric pressure at substantially room temperature, the improvement wherein there is no pressure differential between the pressure of the fill gas and the pressure of the atmosphere surrounding the lamp at the time the interior of the jacket is sealed.

25. The method of claim 24 wherein the fill gas pressure in the lamp at substantially room temperature is subatmospheric.

26. The method of claim 24 wherein the fill gas pressure in the lamp at substantially room temperature is superatmospheric.

27. The method of claim 24 wherein the open tubular passage through the lamp stem is substantially coaxial with the longitudinal axis of the lamp.

28. The method of claim 27 wherein the step of introducing gas into the interior of the outer lamp jacket comprises the steps of inserting the gas dispensing end of a gas dispensing probe into the interior of the outer lamp jacket through the tubular passage and dispensing the gas therefrom.

* * * * *